(12) United States Patent  
Natsume et al.

(10) Patent No.: US 9,174,253 B2  
(45) Date of Patent: Nov. 3, 2015

(54) PURGE NOZZLE UNIT, PURGE APPARATUS AND LOAD PORT

(71) Applicant: SINFONIA TECHNOLOGY CO., LTD., Tokyo (JP)

(72) Inventors: Mitsuo Natsume, Tokyo (JP); Atsushi Suzuki, Tokyo (JP)

(73) Assignee: SINFONIA TECHNOLOGY CO., LTD., Tokyo (JP)

( * ) Notice: Subject to any disclaimer, the term of this patent is extended or adjusted under 35 U.S.C. 154(b) by 456 days.

(21) Appl. No.: 13/762,991

(22) Filed: Feb. 8, 2013

(65) Prior Publication Data

US 2013/0326841 A1   Dec. 12, 2013

(30) Foreign Application Priority Data

Jun. 11, 2012   (JP) .................. 2012-132210

(51) Int. Cl.
| | |
|---|---|
| B65B 1/04 | (2006.01) |
| B08B 9/093 | (2006.01) |
| H01L 21/673 | (2006.01) |
| H01L 21/677 | (2006.01) |

(52) U.S. Cl.
CPC .......... *B08B 9/093* (2013.01); *H01L 21/67393* (2013.01); *H01L 21/67775* (2013.01)

(58) Field of Classification Search
CPC ............... H01L 21/67775; H01L 21/67393; H01L 21/67389; Y10S 414/137; Y10S 414/139
USPC ............. 141/4, 51, 98, 63, 65, 356, 346, 369, 141/351; 206/710; 414/935, 937, 939, 940, 414/217.1
See application file for complete search history.

(56) References Cited

U.S. PATENT DOCUMENTS 8,596,312 B2 * 12/2013 Natsume et al. ................ 141/98

FOREIGN PATENT DOCUMENTS

| JP | 2007-005604 A | 1/2007 |
| JP | 2009-038074 A | 2/2009 |
| JP | 2011-187539 A | 9/2011 |

* cited by examiner

*Primary Examiner* — Jason K Niesz  
(74) *Attorney, Agent, or Firm* — Westerman, Hattori, Daniels & Adrian, LLP

(57) ABSTRACT

A purge nozzle unit 1 includes a nozzle main body 2 including a trunk 41 and a collar section 8 protruding outward from the trunk 41 and a holder 3 including a side wall 31 that is in slidable contact with an outward face of the collar section 8 and a bottom wall 33 having a through hole 32 with which an outward face of the trunk 41 is in slidable contact and is configured such that a vent 30 in communication with the outside is formed in the holder 3 and the nozzle main body 2 is vertically moved relative to the holder 3 by regulating a pressure in a pressure-regulated space S formed between the nozzle main body 2 and the holder 3 and in communication with the vent 30.

5 Claims, 12 Drawing Sheets

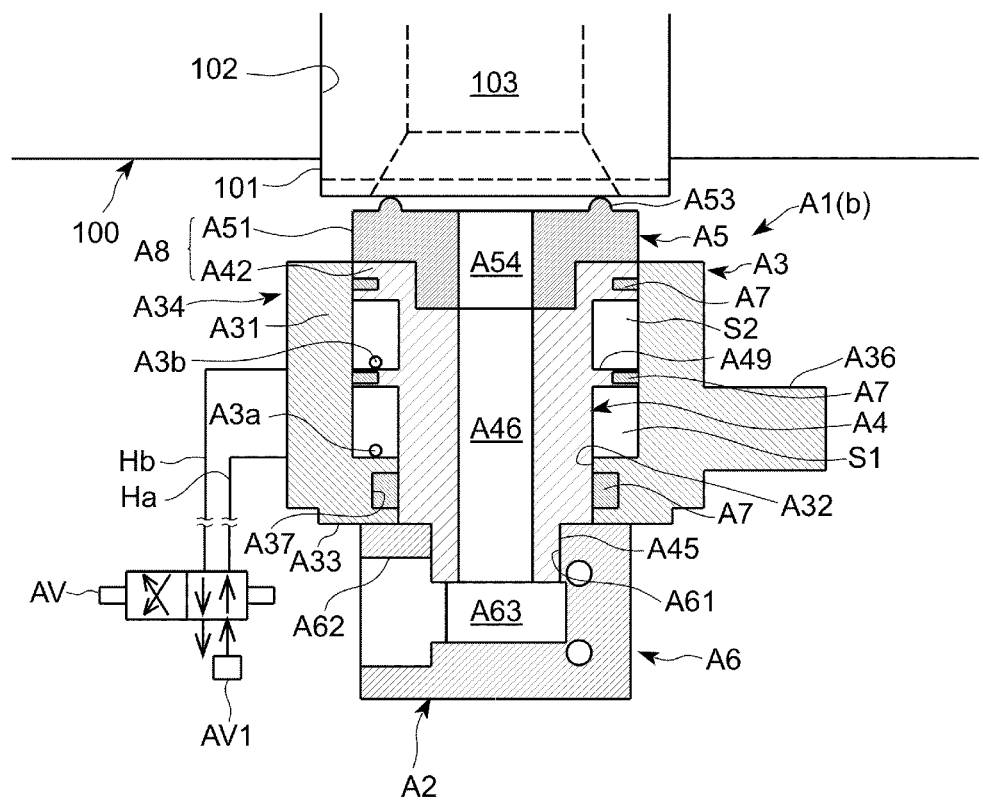

PURGE NOZZLE UNIT, PURGE APPARATUS AND LOAD PORT

BACKGROUND OF THE INVENTION

1. Field of the Invention

The present invention relates to a purge nozzle unit for purging a purge container having a purge space, a purge apparatus including the purge nozzle unit, and a load port.

2. Description of the Related Art

In a semiconductor manufacturing process, wafers are processed in a clean room for improved yield and quality. Instead of increasing the cleanliness of the entire interior of such a clean room, a system that incorporates "mini-environment system," which locally increases the cleanliness only around wafers, has been adopted recently for transporting and otherwise processing wafers. The mini-environment system includes two important elements: a storage container known as a Front-Opening Unified Pod (FOUP) for transporting and retaining a wafer in a highly clean environment; and a load port, which is an interfacing tool for allowing a FOUP to exchange a wafer with a semiconductor manufacturing apparatus and for passing/receiving a FOUP itself to/from a transport apparatus.

A predetermined gaseous atmosphere suitable for water processing and fabrication is maintained in a semiconductor manufacturing apparatus. When a wafer is sent out from a FOUP into the semiconductor manufacturing apparatus, the internal space of the FOUP is communicate with that of the semiconductor manufacturing apparatus. Accordingly, if the environment is less clean in the FOUP than in the semiconductor manufacturing apparatus, air in the FOUP may enter the semiconductor manufacturing apparatus and adversely affect the gaseous atmosphere in the semiconductor manufacturing apparatus. Additionally, when the wafer is retrieved out of the semiconductor manufacturing apparatus into the FOUP, an oxide film may be formed on the surface of the wafer due to moisture, oxygen, or any other gas in a gaseous atmosphere in the FOUP.

As a technique for coping with the above-described problems, Japanese Patent Laid-Open No. 2009-038074 discloses a load port including a purge apparatus that opens a lid of a FOUP at a door section of the load port and blows a predetermined gas (e.g., nitrogen or inert gas) into the FOUP by a purge section (purge nozzle) provided on the semiconductor manufacturing apparatus side while internal spaces of the FOUP and the semiconductor manufacturing apparatus communicate with each other.

However, the purge apparatus using a so-called front purge system, which injects a predetermined gas from the front (the semiconductor manufacturing apparatus side) into a FOUP opened to the internal space of the semiconductor manufacturing apparatus through a carrying-in/carrying-out port and replaces the atmosphere in the FOUP with the predetermined gas, suffers from a disadvantage. The problem is that since the purging is performed while an opening of the FOUP is left open, and the internal space of the FOUP is in direct communication with the entire internal space of the semiconductor manufacturing apparatus, it is difficult to keep high concentration of the predetermined gas in the atmosphere in a FOUP, resulting in a lower maximum concentration of the predetermined gaseous atmosphere.

Japanese Patent Laid-Open No. 2011-187539 discloses a load port including a purge apparatus that injects a predetermined gas (e.g., nitrogen or inert gas) into a FOUP loaded with wafers placed on a table of the load port from the bottom to fill the FOUP and replace the atmosphere in the FOUP with the predetermined gas. The purge apparatus using a so-called bottom purge system, which injects gas such as nitrogen or dry air from the bottom of a FOUP into the FOUP and replaces the atmosphere in the FOUP with the predetermined gas, has an advantage over a purge apparatus using the front purge system in that a higher maximum concentration of the predetermined gaseous atmosphere can be reached.

Assume a case of a bottom purge system that has a purge nozzle always protruding upward from the top of table. In this case, when a FOUP is placed on the table, the purge nozzle is likely to hit against or be caught on a part of the FOUP before the FOUP is positioned by a positioning pin on the table, which may lead to a failure of the FOUP to be placed at an intended position.

A FOUP is often placed from above a load port onto the table by a transport apparatus such as an OHT (Overhead Hoist Transfer). A swing of the FOUP at the time of transport and placement is likely to cause the above-described problem. In addition, an injector (purge port) made of a resin provided on a bottom of the FOUP and brought into (close) contact with the purge nozzle at the time of purging may rub against the purge nozzle and wear at the time of placement of the FOUP on the table prior to purging.

For this reason, Japanese Patent Laid-Open No. 2011-187539 discloses a purge apparatus including a drive unit that moves a nozzle so as to contact with a purge port formed in a bottom of a FOUP while a positioning pin on a table is engaged with a positioning groove provided on the bottom of the FOUP.

As a specific example of the drive unit, Japanese Patent Laid-Open No. 2011-187539 discloses one that includes a pair of left and right air cylinders attached to opposite sides of a nozzle holder holding a nozzle and a common elevating plate whose opposite ends connected to working ends of the air cylinders and whose center is provided with the nozzle. The unit moves the nozzle up and down by driving the air cylinders in sync with each other to vertically move the elevating plate.

The example, however, involves air cylinders attached to opposite sides of the nozzle holder, and at least the top view dimensions of the nozzle holder increases by an amount corresponding to the air cylinders, which leads to the difficulty in size reduction.

Additionally, if such a pair of left and right air cylinders are not in sync with each other, an up-and-down action of the elevating plate and vertical movement of the nozzle holder and the nozzle itself associated with the up-and-down action of the elevating plate may become unstable or impossible.

Note that the above-described problems are not specific to a purge apparatus of a load port and may occur in a purge apparatus of something other than a load port, such as that of a storage or of a purge station.

SUMMARY OF THE INVENTION

The present invention has been made in consideration of the above-described problems, and has its main object to provide a purge nozzle unit that adopts a bottom purge system capable of purging leading to a high maximum concentration of a predetermined gaseous atmosphere while allowing a reduction in the number of parts and size, a purge apparatus including the purge nozzle unit, and a load port.

That is, the present invention relates to a purge nozzle unit capable of replacing a gaseous atmosphere in a purge container with purge gas composed of nitrogen or dry air through a port provided on a bottom of the purge container. A "purge container" according to the present invention encompasses all containers such as a FOUP that have an internal purge space.

A purge nozzle unit according to the present invention includes a nozzle main body including a trunk that allows purge gas to pass through and a collar section that protrudes outward from the trunk and a holder including a side wall that is in slidable contact with an outward face of the collar section and a bottom wall having a through hole in which the trunk is inserted while an outward face of the trunk is in slidable contact with the through hole. The holder has a vent in communication with the outside, the vent formed in at least a part of the holder, and the nozzle main body is vertically moved relative to the holder by regulating a pressure in a pressure-regulated space that is formed between the nozzle main body and the holder and communicates with the vent.

As described above, the purge nozzle unit according to the present invention is configured such that the nozzle main body is vertically moved relative to the holder by regulating the pressure in the pressure-regulated space formed between the nozzle main body and the holder through the vent formed in the holder. Aside from the two parts, any other mechanisms dedicated to vertically moving the nozzle main body thus need not be separately provided. This effectively simplifies the structure and reduces cost.

The purge nozzle unit according to the present invention, which is composed of two parts as units: the nozzle main body and holder, also achieves a reduction in the overall size of the purge nozzle unit. The purge nozzle unit does not need control for simultaneously extending/contracting cylinders, as compared to an example that vertically moves the nozzle main body by, e.g., simultaneously extending/contracting a plurality of cylinders. The purge nozzle unit can vertically move the nozzle main body highly accurately with relatively simple control of regulating the pressure in the pressure-regulated space and can provide higher reliability.

Additionally, the purge nozzle unit according to the present invention can vertically move the nozzle main body while the outward face of the collar section of the nozzle main body is in slidable contact with an inward face of the side wall of the holder and the outward face of the trunk of the nozzle main body is in slidable contact with the through hole in the bottom wall of the holder. This configuration allows smooth and reliable vertical movement of the nozzle main body.

In a specific example of the purge nozzle unit according to the present invention, in particular, one pressure-regulated space is formed between the holder and the nozzle main body, and the nozzle main body is moved up by supplying gas into the pressure-regulated space through the vent to increase the pressure in the pressure-regulated space and is moved down by discharging gas in the pressure-regulated space to the outside through the common vent to reduce the pressure in the pressure-regulated space.

In another specific example of the purge nozzle unit according to the present invention, two pressure-regulated spaces separated in a height direction are formed between the nozzle main body and the holder, the nozzle main body is moved up by supplying gas into a lower one of the pressure-regulated spaces through a vent that communicates with the lower pressure-regulated space and discharging gas in an upper one of the pressure-regulated spaces to the outside through a vent that communicates with the upper pressure-regulated space to make a pressure in the lower pressure-regulated space higher than a pressure in the upper pressure-regulated space, and the nozzle main body is moved down by supplying gas into the upper pressure-regulated space through the vent in communication with the upper pressure-regulated space and discharging gas in the lower pressure-regulated space to the outside through the vent in communication with the lower pressure-regulated space to make the pressure in the upper pressure-regulated space higher than the pressure in the lower pressure-regulated space.

The former example has one pressure-regulated space formed between the nozzle main body and the holder and has an advantage over the latter example in that vertical movement of the nozzle main body can be accomplished only by regulating the pressure in the only one pressure-regulated space.

The latter example is structurally different from the former example in that pressure-regulated spaces in two stages are formed between the nozzle main body and the holder and an up-and-down action of the nozzle main body can be performed only by regulating a pressure difference between the pressure-regulated spaces in different stages.

A purge apparatus according to the present invention includes a plurality of the above-described purge nozzle units and is configured to be capable of replacing a gaseous atmosphere in a purge container with nitrogen or dry air while the nozzle main bodies of the purge nozzle units are in communication with a plurality of ports provided on a bottom of the purge container.

A load port according to the present invention is provided adjacent to a semiconductor manufacturing apparatus in a clean room to receive a transported FOUP as a purge container and load a wafer stored in the FOUP into the semiconductor manufacturing apparatus and unload the wafer from the semiconductor manufacturing apparatus into the FOUP through a carrying-in/carrying-out port formed in a front face of the FOUP. The load port includes a purge apparatus with the above-described configuration.

The above-described purge apparatus and load port can each achieve the advantages by means of the purge nozzle unit. Despite a structure that can achieve a size reduction, purging leading to a high maximum concentration of a predetermined gaseous atmosphere can be efficiently and accurately performed.

The present invention has adopted the novel technical idea of moving a nozzle main body itself up and down by regulating an air pressure in a space formed between the nozzle main body and a holder. This allows provision of a purge nozzle unit that can purge a purge container leading to a high maximum concentration of a predetermined gaseous atmosphere while allowing a reduction in the number of parts and size, a purge apparatus using the purge nozzle unit, and a load port including the purge apparatus.

BRIEF DESCRIPTION OF THE DRAWINGS

FIG. 12 is a cross-sectional view of the purge nozzle unit with the nozzle main body at the purge position in the embodiment, taken along line y-y in FIG. 8.

DETAILED DESCRIPTION OF THE PREFERRED EMBODIMENT

One embodiment of the present invention will be described below with reference to the drawings.

Figure 1:
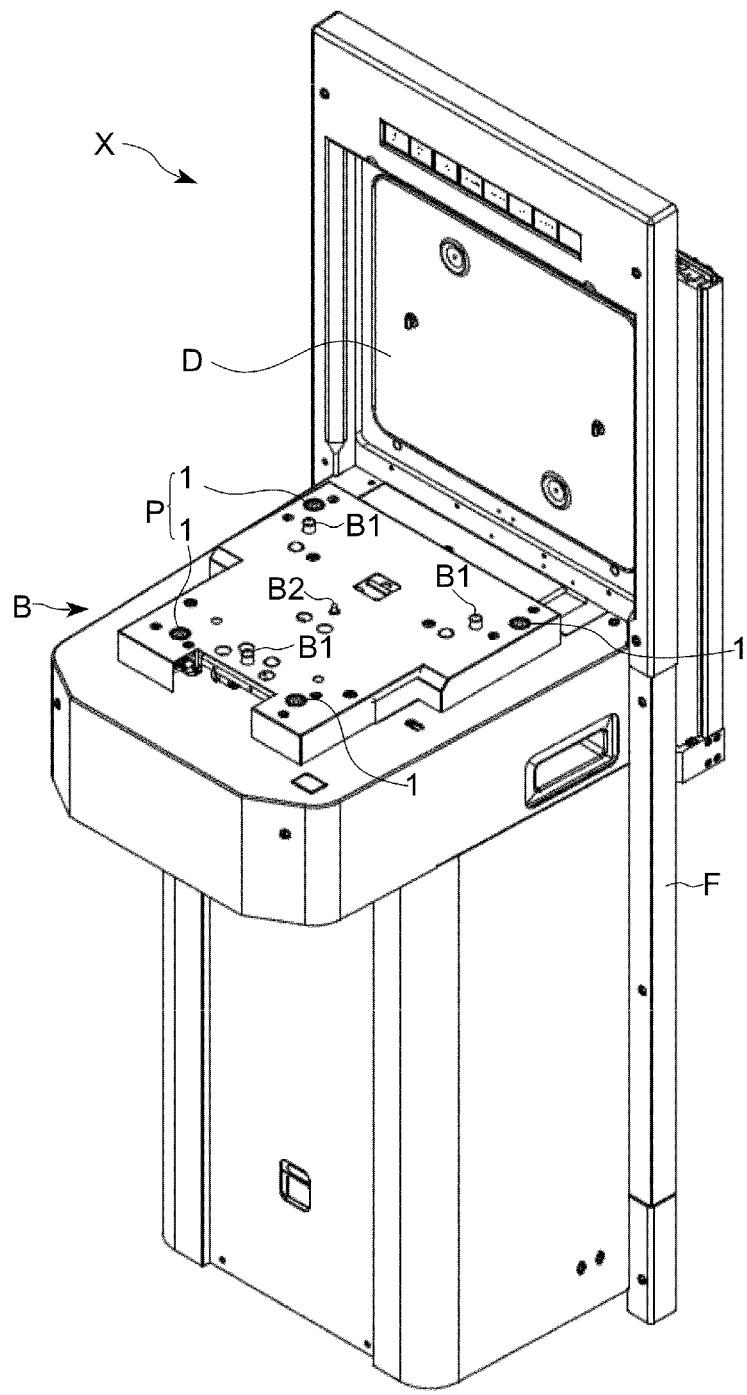
FIG. 1 is a view of the overall configuration of a load port according to an embodiment of the present invention.

A purge nozzle unit 1 according to the present embodiment can be attached to a purge apparatus P used in a load port X shown in FIG. 1, for example. The load port X is used in a semiconductor manufacturing process and is arranged adjacent to a semiconductor manufacturing apparatus (not shown) in a clean room. The load port X opens/closes a lid of a FOUP 100, which is an example of a purge container according to the present invention, while a door section D is in close contact with the lid, and loads/unloads a wafer (not shown), which is a stored item in the FOUP 100, into/from the semiconductor manufacturing apparatus.

Figure 5:
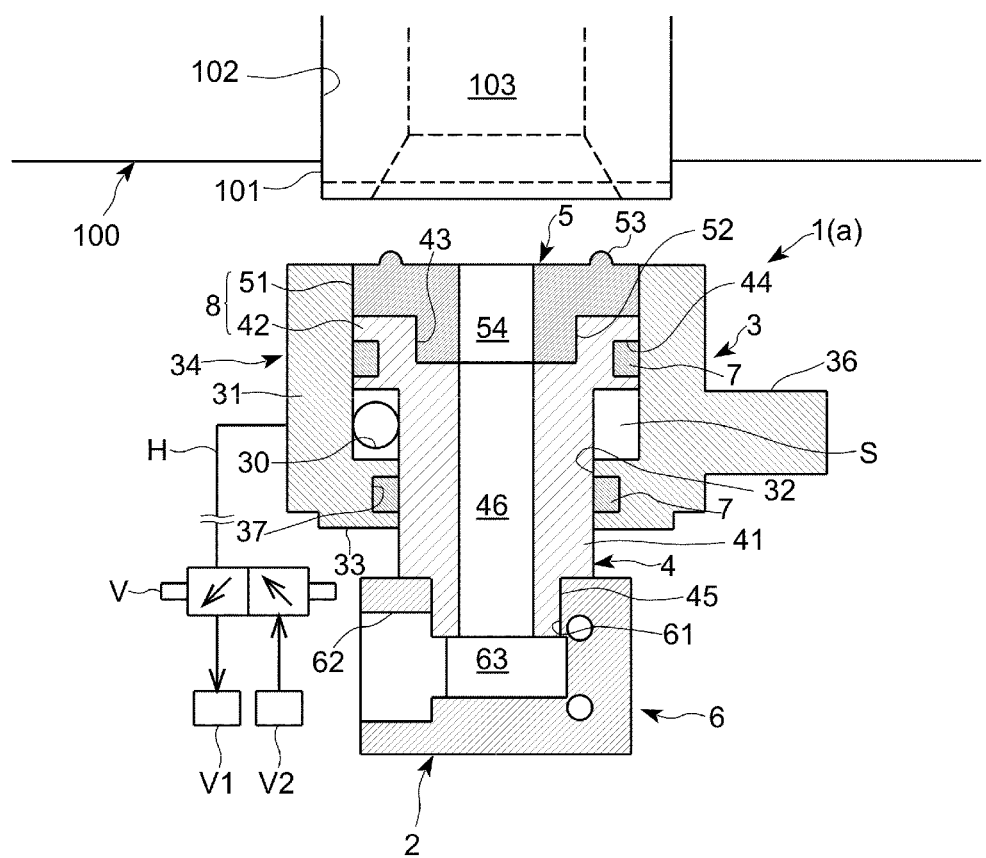
FIG. 5 is a cross-sectional view of the purge nozzle unit with the nozzle main body at the standby position in the embodiment, taken along line y-y in FIG. 2.

The FOUP 100 used in the present embodiment is of a known type, which stores a plurality of wafers therein, is configured to be capable of loading/unloading the wafers through a carrying-in/carrying-out port formed in a front face, and includes a lid that can open/close the carrying-in/carrying-out port, and a detailed description thereof will be omitted. Note that the front face of the FOUP 100 in the present embodiment refers to a surface that faces the door section D of the load port X when the FOUP 100 is placed on the load port X. As shown in FIG. 5 (to be described later), a bottom of the FOUP 100 has purge ports 101 provided at predetermined locations. Each port 101 is mainly composed of, for example, a hollow cylindrical grommet seal fit in an opening 102 formed in the bottom of the FOUP 100. A valve (not shown) that switches from a closed state to an opened state by the injection pressure or discharge pressure of gas (to be described later) such as nitrogen, inert gas, or dry air (note that nitrogen gas is used in the present embodiment and may be referred to as "purge gas" in the description below) is provided in the grommet seal.

The semiconductor manufacturing apparatus includes, for example, a semiconductor manufacturing apparatus main body that is located relatively farther from the load port X and a transfer chamber that is arranged between the semiconductor manufacturing apparatus main body and the load port X. For example, a transfer machine that transfers the wafers in the FOUP 100 one at a time between the FOUP 100 and the transfer chamber and between the transfer chamber and the semiconductor manufacturing apparatus main body is provided in the transfer chamber. Note that it is also possible to transfer a whole cassette itself with a plurality of wafers stored therein between the FOUP 100 and the semiconductor manufacturing apparatus (the semiconductor manufacturing apparatus main body and transfer chamber). In such a setup, the inside of the semiconductor manufacturing apparatus main body, transfer chamber, and FOUP 100 is kept highly clean in the clean room while a space where the load port X is arranged, i.e., outside the semiconductor manufacturing apparatus main body, transfer chamber, and FOUP 100, is less clean.

As shown in FIG. 1, the load port X includes a frame F that is arranged in a vertical posture and includes the door section D that can open/close an opening so as to be in communication with the carrying-in/carrying-out port of the FOUP 100, a table B of the frame F that extends in a substantially horizontal posture in a direction away from the semiconductor manufacturing apparatus, and the purge apparatus P that can replace a gaseous atmosphere in the FOUP 100 with purge gas such as nitrogen gas by injecting the purge gas into the FOUP 100.

In a state in which the FOUP 100 is placed on the table B, the door section D provided on the frame F can move between an opened position where the door section D in close contact with the lid (not shown) provided on the front face of the FOUP 100 pushes the lid to open the carrying-in/carrying-out port and a closed position where the door section D closes the carrying-in/carrying-out port. As a door elevating mechanism (not shown) for at least vertically moving the door section D between the opened position and the closed position, any known type of mechanism can be used.

The table B is provided in a substantially horizontal posture at a position a little closer to the top from a center in a height direction of the frame F and has a plurality of upwardly-protruding positioning protrusions B1 (kinematic pins). The FOUP 100 on the table B is positioned by engaging the positioning protrusions B1 with positioning recesses (not shown) formed in the bottom of the FOUP 100. An example of the positioning protrusion B1 is configured such that an upper portion that contacts a positioning recess of inverted-V shape in cross-section composed of opposing inclined wall surfaces is provided with a curved surface and the curved surface of the upper portion can contact the inclined wall surfaces of the positioning recess in a balanced manner. The table B also has a seating sensor B2 that detects whether the FOUP 100 is placed at a predetermined position on the table B. The structures and locations of the positioning protrusion B1 and seating sensor B2 can be appropriately set and changed according to standards and the like. Note that a table including a movement mechanism for moving the placed FOUP 100 between a position where the carrying-in/carrying-out port (lid) is closest to the opening (door section D) of the frame F and a position where the carrying-in/carrying-out port is spaced apart from the opening (door section D) by a predetermined distance can also be used as the table B.

The purge apparatus P includes a plurality of purge nozzle units 1 that are arranged at predetermined locations with upper ends exposed at the table B and causes each of the plurality of purge nozzle units 1 to function as an injection purge nozzle unit that injects purge gas or a discharge purge nozzle unit that discharges a gaseous atmosphere in the FOUP 100. The ratios of injection purge nozzle units and discharge purge nozzle units to all the purge nozzle units may be equal or one of the ratios may be higher than the other.

The plurality of purge nozzle units 1 can be attached to appropriate positions on the table B corresponding to the positions of the ports 101 provided on the bottom of the FOUP 100. Each purge nozzle unit 1 (injection purge nozzle unit or discharge purge nozzle unit) has a valve function for regulating backflow of gas and can contact the port 101 provided on the bottom of the FOUP 100. Note that, of the plurality of ports 101 provided on the bottom of the FOUP 100, the port 101 that contacts an injection purge nozzle unit functions as an injection port, while the port 101 that contacts a discharge purge nozzle unit functions as a discharge port.

Figure 2:
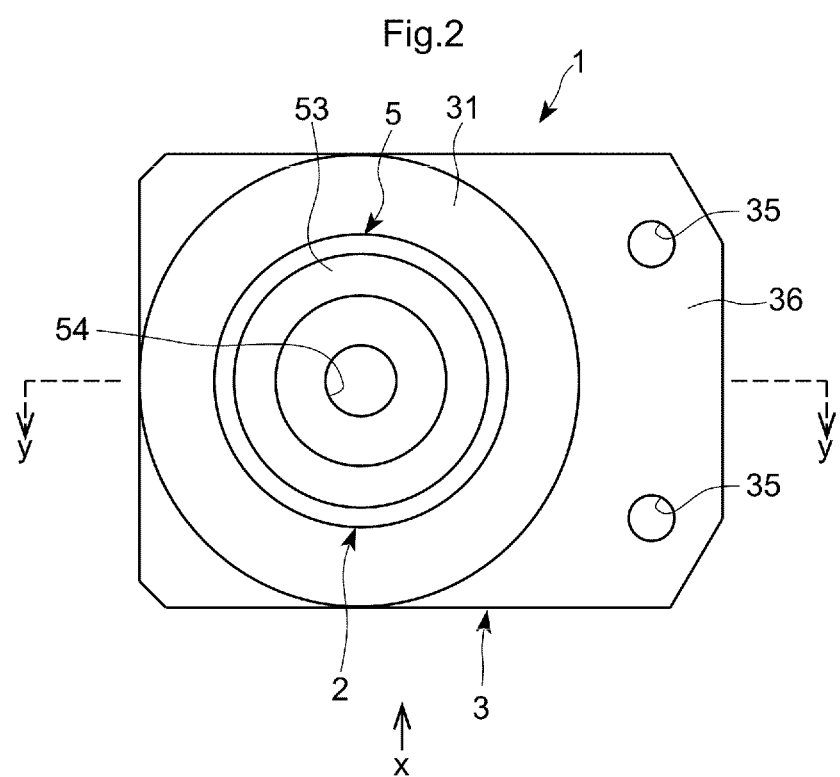
FIG. 2 is a plan view of a purge nozzle unit according to the embodiment.
Figure 3:
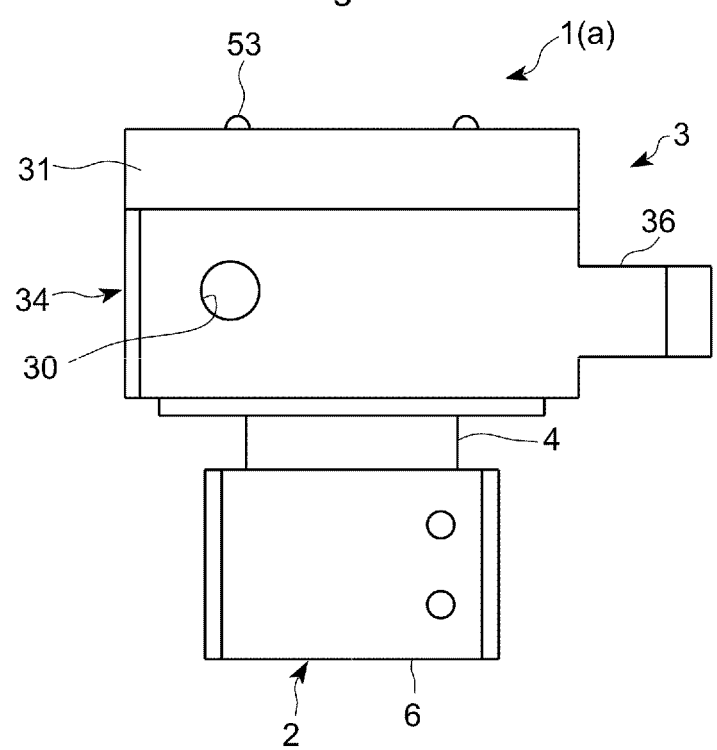
FIG. 3 is a view of the purge nozzle unit with a nozzle main body at a standby position in the embodiment, taken in the direction of an arrow x in FIG. 2.
Figure 4:
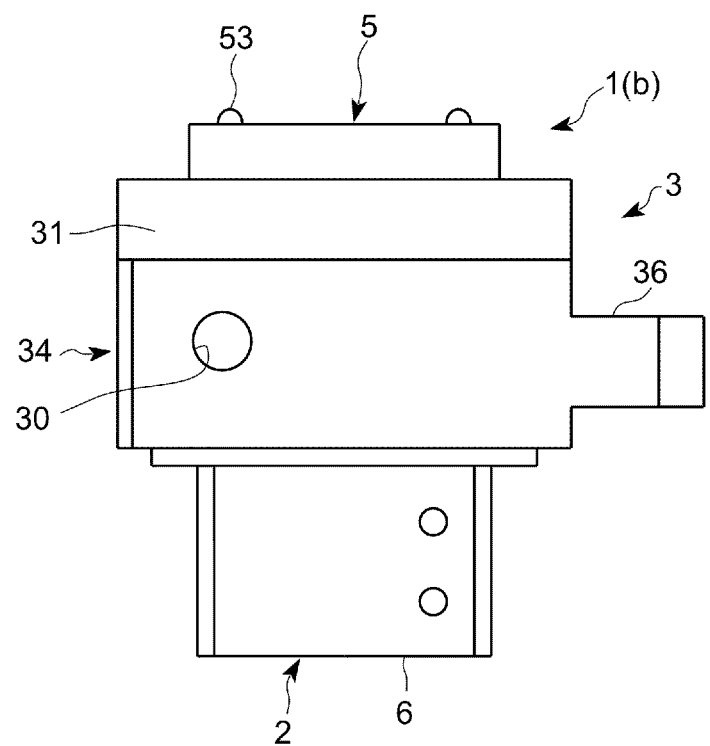
FIG. 4 is a view of the purge nozzle unit with the nozzle main body at a purge position in the embodiment, taken in the direction of the arrow x in FIG. 2.
Figure 6:
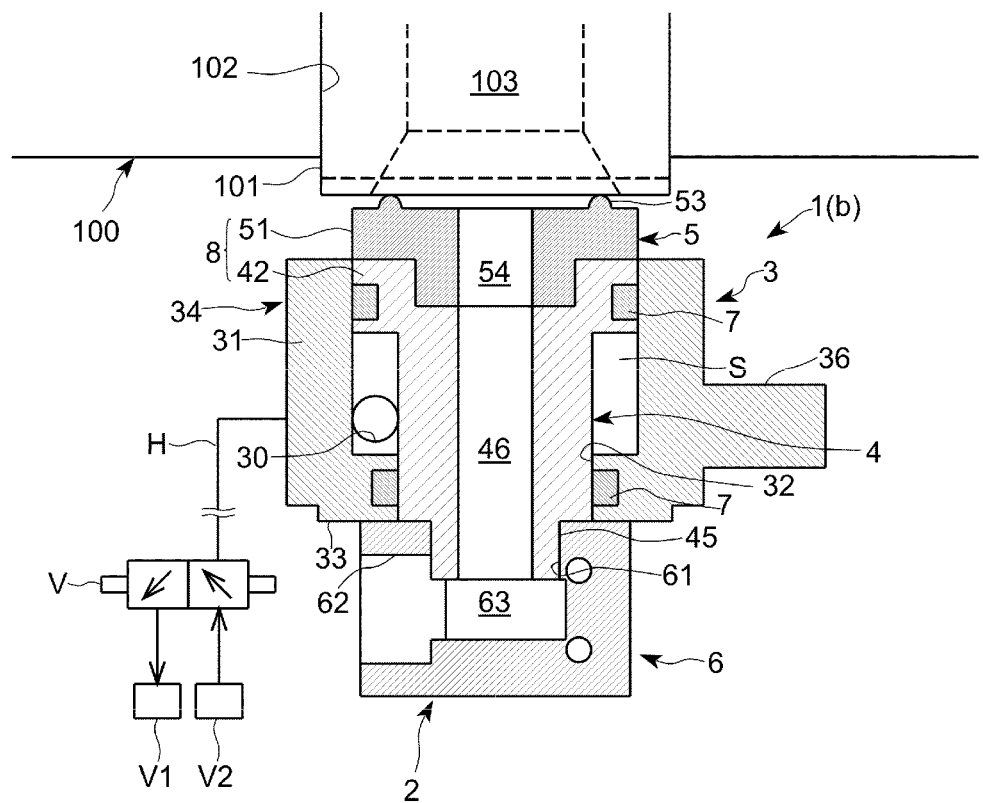
FIG. 6 is a cross-sectional view of the purge nozzle unit with the nozzle main body at the purge position in the embodiment, taken along line y-y in FIG. 2.

As shown in FIGS. 2 to 6 (FIG. 2 is a plan view of the purge nozzle unit 1, FIGS. 3 and 4 are views taken in the direction of an arrow x in FIG. 2, and FIGS. 5 and 6 are cross-sectional views taken along line y-y in FIG. 2), each purge nozzle unit 1 includes a nozzle main body 2 and a holder 3 that holds the nozzle main body 2 such that the nozzle main body 2 can move up and down.

The nozzle main body 2 includes a main body section 4 that is mainly composed of a cylindrical trunk 41 and a large-diameter tubular section 42 larger in outer diameter than the trunk 41, a nozzle head 5 that can be attached to an upper end of the main body section 4, and a nozzle bottom 6 that can be attached to a lower end of the main body section 4.

A recess 43 for receiving the nozzle head 5 is formed in the upper end of the main body section 4 (a top face of the large-diameter tubular section 42). A ring-shaped recess 44 for receiving a seal member 7 to contact a side wall 31 of the holder 3 (to be described later) is formed in an outer side surface of the large-diameter tubular section 42. In the present embodiment, a small-diameter tubular section 45 having an outer diameter smaller than the outer diameter of the trunk 41 is provided on a lower end of the trunk 41, and the nozzle bottom 6 can be fit on the small-diameter tubular section 45. A purge gas flow path 46 is formed in a shaft center portion of the main body section 4 to extend therethrough in the height direction. The main body section 4 according to the present embodiment is made of metal and includes the components integral to each other.

The nozzle head 5 includes a head main body 51 having the same outer diameter as the large-diameter tubular section 42 of the main body section 4, a fitting protrusion 52 that protrudes downward from a lower end of the head main body 51 and can fit in (be press-fit in) the recess 43 of the main body section 4, and a port contact section 53 that is provided on a top face of the head main body 51 and can contact the port 101 (injection port or discharge port). In the present embodiment, the port contact section 53 is constructed as a ring-shaped upward protrusion protruding upward from the top face of the head main body 51. A head-side purge gas flow path 54 is formed in a shaft center portion of the nozzle head 5 to extend therethrough in the height direction and communicate with the purge gas flow path 46 of the main body section 4. The nozzle head 5 according to the present embodiment is made of metal and includes the components integral to each other.

In a state in which the fitting protrusion 52 of the nozzle head 5 is fit in the recess 43 of the main body section 4 and the two members are assembled together, the large-diameter tubular section 42 of the main body section 4 and the head main body 51 of the nozzle head 5 form an outer side surface (outward face) that is smoothly continuous in the height direction. The large-diameter tubular section 42 of the main body section 4 and the head main body 51 of the nozzle head 5 correspond to a collar section 8 according to the present invention.

The nozzle bottom 6 has a fitting recess 61 that can fit on the small-diameter tubular section 45 of the main body section 4 in a top face and is in the form of a rectangular cup. The nozzle bottom 6 includes a pipe-mounting recess 62 to which a flexible pipe connected to a purge gas source (not shown) can be attached and a bottom-side purge gas flow path 63 that communicates with an internal space of the pipe attached to the pipe-mounting recess 62 and communicates with the purge gas flow path 46 of the main body section 4. The width dimension of the nozzle bottom 6 is set to be larger than the outer diameter of the trunk 41 of the main body section 4 in a state in which the fitting recess 61 of the nozzle bottom 6 and the small-diameter tubular section 45 of the main body section 4 are assembled together while the fitting recess 61 fits on the small-diameter tubular section 45.

The holder 3 is mainly composed of a holder main body 34 including the side wall 31 with which an outward face (outer peripheral surface) of the collar section 8 of the nozzle main body 2 is in slidable contact and a bottom wall 33 that protrudes inward (toward the center) from a lower end of the side wall 31 and has a through hole 32, in which only the trunk 41 of the nozzle main body 2 can be inserted, formed at a center and includes a fixed section 36 that protrudes sideward from the holder main body 34 and has screw insertion holes 35 formed at predetermined locations. In the present embodiment, of the side wall 31, an upper portion is defined in the form of a circular tube while the remaining portion is defined in the form of a rectangular tube. Of the holder 3, a part of the side wall 31 has a vent 30 that communicates with the outside. The opening size of the through hole 32 formed in the bottom wall 33 is set such that an outward face of the trunk 41 of the nozzle main body 2 is in slidable contact with the through hole 32. A ring-shaped recess 37 for receiving the seal member 7 to contact the trunk 41 of the nozzle main body 2 is formed in an inward face of the through hole 32.

In order to cause the holder 3 to inseparably hold the nozzle main body 2, the main body section 4 may be inserted from above the holder 3 into the holder 3 while the nozzle bottom 6 is yet to be assembled to the small-diameter tubular section 45 of the main body section 4, the small-diameter tubular section 45 may be exposed from the through hole 32 in the bottom wall 33 to outside the holder 3, and the small-diameter tubular section 45 may be press-fit into the fitting recess 61 of the nozzle bottom 6. In the assembled state, the collar section 8 or the nozzle bottom 6 of the nozzle main body 2 rests against the bottom wall 33 of the holder 3, preventing the nozzle main body 2 from coming off. Note that assembly of the nozzle head 5 to the main body section 4 of the nozzle main body 2 may be done before or after the main body section 4 is put into the holder 3. Since a top face of the main body section 4 (the top face of the large-diameter tubular section 42) and a bottom face of the head main body 51 are set to be respective flat horizontal surfaces, the port contact section 53 of the nozzle head 5 (an upper end of the nozzle head 5) also has a flat horizontal surface in an attached state in which the horizontal surfaces abut on each other.

In the present embodiment, the nozzle main body 2 and holder 3 assembled together constitute the purge nozzle unit 1.

The purge nozzle unit 1 according to the present embodiment employs gas (pressurized air) as a drive source that vertically moves the nozzle main body 2 relative to the holder 3. The purge nozzle unit 1 is configured to regulate a pressure in a pressure-regulated space S that is a space formed between the holder 3 and the nozzle main body 2 and around which gas can circulate through the vent 30 formed in the side wall 31 of the holder 3 by supplying gas into the pressure-regulated space S or discharging gas in the pressure-regulated space S to outside the pressure-regulated space S, thereby vertically moving the nozzle main body 2 relative to the holder 3.

More specifically, the pressure-regulated space S is a space that is delimited by the trunk 41 and collar section 8 of the nozzle main body 2 and the side wall 31 and bottom wall 33 of the holder 3. In the present embodiment, high airtightness of the pressure-regulated space S is ensured by interposing the seal member 7 between the collar section 8 and the side wall 31 and between the trunk 41 and the bottom wall 33.

In the present embodiment, a pipe H is connected to the vent 30 formed in the side wall 31 of the holder 3 and the operation of a switching section V (e.g., an electromagnetic valve (solenoid valve)) is controlled. The switching section V can be switched between a pressured state in which the pressure in the pressure-regulated space S is increased by injecting gas into the pressure-regulated space S through the pipe H and vent 30 and a negative pressure state in which the pressure in the pressure-regulated space S is reduced by evacuating the pressure-regulated space S, so as to move the nozzle main body 2 vertically relative to the holder 3. Note that a gas source V2 and a vacuum source V1 are connected to the switching section V in parallel.

In the present embodiment, regulation of the pressure in the pressure-regulated space S allows the nozzle main body 2 to be vertically moved between a position shown in FIGS. 3 and 5, i.e., a standby position (a) where a top face of the nozzle main body 2 (a top face of the nozzle head 5) and a top face of the holder 3 (a top face of the side wall 31) are substantially level with each other and the port contact section 53 is not in contact with the port 101 of the FOUP 100 and a position shown in FIGS. 4 and 6, i.e., a purge position (b) where the top face of the nozzle main body 2 (the top face of the nozzle head 5) is above the level of the top face of the holder 3 (the top face of the side wall 31) and the port contact section 53 of the nozzle main body 2 can contact the port 101 of the FOUP 100. The nozzle main body 2 is configured such that, when the nozzle main body 2 moves vertically, the outward face of the collar section 8 of the nozzle main body 2 comes into sliding contact with an inward face of the side wall 31 of the holder main body 34, and the outward face of the trunk 41 of the nozzle main body 2 comes into sliding contact with the inward face of the through hole 32 formed in the bottom wall 33. This configuration allows smooth and reliable vertical movement of the nozzle main body 2.

The purge nozzle units 1 according to the present embodiment described in detail above function as the purge apparatus P that can replace a gaseous atmosphere in the FOUP 100 placed on the table B with purge gas by being attached to a plurality of predetermined locations on the table B of the load port X (near four corners of the table B in the present embodiment) in unit forms. Note that a process of attaching each purge nozzle unit 1 to the table B can be accomplished by fixing the purge nozzle unit 1 to the table B at an appropriate location using screws (not shown) inserted in the screw insertion holes 35 formed in the fixed section 36 of the holder 3. The top face of the holder 3 is set to be substantially level with a top face of the table B in the fixed state.

The usage and action of the load port X in which the purge nozzle units 1 with the above-described configuration are provided to the table B will be described.

First, the FOUP 100 is transported by a transport apparatus such as an OHT (not shown) to the load port X and is placed on the table B. Each nozzle main body 2 can be positioned at the standby position (a) by setting the switching section V to the negative pressure state at this time. The positioning protrusions B1 fit in and come into contact with the positioning recesses of the FOUP 100 to allow the FOUP 100 to be placed at a predetermined normal position on the table B. The seating sensor B2 detects that the FOUP 100 is placed at the normal position on the table B. At this time, each nozzle main body 2 is at its standby position (a) and is not in contact with the port 101. That is, the standby position (a) of the nozzle main body 2 is a position where an upper end of the nozzle main body 2 (the port contact section 53) is below the level of a lower end of the port 101 provided on the FOUP 100 while the positioning protrusions B1 engage with the positioning recesses, and the FOUP 100 is placed on the table B.

After the seating sensor B2 detects a normal seated state of the FOUP 100, the load port X according to the present embodiment switches the switching section V from the negative pressure state to the pressurized state to move up the nozzle main body 2 from the standby position (a) to the purge position (b). That is, the load port X injects gas into the pressure-regulated space S through the vent 30 formed in the side wall 31 of the holder 3 and the pipe H connected to the vent 30, increases the pressure in the pressure-regulated space S, and moves up the nozzle main body 2 relative to the holder 3.

As a result, as shown in FIG. 6, the port contact section 53 of the nozzle main body 2 comes into contact with the lower end of the port 101, an internal space 103 of the port 101 and the head-side purge gas flow path 54, purge gas flow path 46, and bottom-side purge gas flow path 63 of the nozzle main body 2 communicate with each other. In this state, the load port X according to the present embodiment injects purge gas supplied from the source (not shown) into the FOUP 100 through the internal space of the pipe, the bottom-side purge gas flow path 63, the purge gas flow path 46, the head-side purge gas flow path 54, and the internal space 103 of the port 101 and discharges gas that fills the FOUP 100 to outside the FOUP 100 through the discharge port(s) and discharge purge nozzle unit(s). Note that it is also possible to start discharge in advance of injection, discharge a certain amount of air in the FOUP 100 to outside the FOUP 100, and perform injection under reduced pressure.

After or during the above-described purging, the load port X according to the present embodiment sequentially expels wafers from the FOUP 100 into the semiconductor manufacturing apparatus through the carrying-in/carrying-out port of the FOUP 100 that communicates with the opening of the frame F. Each wafer transferred into the semiconductor manufacturing apparatus is then subjected to a semiconductor manufacturing process by the semiconductor manufacturing apparatus main body. The wafers having undergone the semiconductor manufacturing process by the semiconductor manufacturing apparatus main body are sequentially stored in the FOUP 100.

The load port X according to the present embodiment can continue bottom purging by the purge apparatus P even at the time of loading/unloading wafers. The load port X can continue replacing a gaseous atmosphere in the FOUP 100 with purge gas such as nitrogen gas during loading/unloading of wafers and keep the concentration of the purge gas in the FOUP 100 high.

When all the wafers have undergone the semiconductor manufacturing process and are stored in the FOUP 100, the load port X moves the door section D from the opened position to the closed position while the door section D is in close contact with the lid of the FOUP 100. With this operation, the opening of the load port X and the carrying-in/carrying-out port of the FOUP 100 are closed. The FOUP 100 placed on the table B is then carried out by a transport mechanism (not shown) to a next process. Note that the FOUP 100 containing wafers that have undergone the semiconductor manufacturing process may be subjected to bottom purging again, as needed. In this case, it is possible to immediately start purging the FOUP 100 containing wafers that have undergone the semiconductor manufacturing process to prevent the processed wafers from being oxidized.

As has been described in detail above, the load port X according to the present embodiment can keep a high degree of filling (the degree of replacement) with purge gas in the FOUP 100 through bottom purging by the purge apparatus P.

Of a plurality of wafers stored in the common FOUP 100, a first one stored in the FOUP 100 after the semiconductor manufacturing process is generally subjected to a gaseous atmosphere, in which the degree of filling (the degree of replacement) with purge gas decreases as wafer loading/unloading time passes, in the FOUP 100 and may be slightly adversely affected until the last one undergone the semiconductor manufacturing process is stored in the FOUP 100. By injecting purge gas into the FOUP 100 by the purge apparatus P, a reduction in the degree of filling (the degree of replacement) with purge gas in the FOUP 100 can be effectively inhibited, and wafers can be stored in good condition in the FOUP 100.

At a predetermined time when or after the FOUP 100 containing wafers that have undergone the semiconductor manufacturing process is passed to the transport mechanism, the switching section V is switched from the pressurized state to the negative pressure state, and each nozzle main body 2 is moved down from the purge position (b) to the standby position (a). That is, the pressure in the pressure-regulated space S is reduced by evacuating the pressure-regulated space S through the vent 30 formed in the side wall 31 of the holder 3 and the pipe H connected to the vent 30, and the nozzle main body 2 is moved down relative to the holder 3. As a result, the nozzle main body 2 can be prevented from interfering with a bottom face of the FOUP 100 containing unprocessed wafers when the FOUP 100 is received from the transport mechanism onto the table B.

As described above, the purge nozzle unit 1 according to the present embodiment, which is composed of two parts as units: the nozzle main body 2 and holder 3, is configured to vertically move the nozzle main body 2 relative to the holder 3 by regulating the pressure in the pressure-regulated space S formed between the nozzle main body 2 and the holder 3 through the vent 30 formed in the side wall 31 of the holder 3. That is, in the purge nozzle unit 1 according to the present embodiment, an up-and-down action of the nozzle main body 2 can be performed by causing the nozzle main body 2 to operate as a piston (cylinder shaft) relative to the holder 3 as a cylinder, and aside from the two parts, any other mechanisms for vertically moving the nozzle main body 2 need not be separately provided. This achieves not only a reduction in the number of parts and a cost reduction but also a reduction in the overall size of the purge nozzle unit 1.

Additionally, the purge nozzle unit 1 according to the present embodiment is configured such that the nozzle main body 2 is vertically moved while the outward face of the collar section 8 of the nozzle main body 2 is in slidable contact with the inward face of the side wall 31 of the holder 3 and the outward face of the trunk 41 of the nozzle main body 2 is in slidable contact with the inward face of the through hole 32 in the bottom wall 33 of the holder 3. This allows smooth and reliable vertical movement of the nozzle main body 2.

Moreover, as for the purge nozzle unit 1 according to the present embodiment, the assembly work of causing the holder 3 to hold the nozzle main body 2 to form a unit is easy. The purge nozzle unit 1 does not need control for simultaneously extending/contracting cylinders, as compared to an example that vertically moves the nozzle main body 2 by simultaneously extending/contracting a plurality of cylinders. The purge nozzle unit 1 can vertically move the nozzle main body 2 highly accurately with simple control of regulating the pressure in the pressure-regulated space S and achieves high reliability.

In particular, the purge nozzle unit 1 according to the present embodiment has one pressure-regulated space S formed between the holder 3 and the nozzle main body 2 and is configured to move up the nozzle main body 2 by placing the only one pressure-regulated space S in the pressurized state through the vent 30 and to move down the nozzle main body 2 by placing the pressure-regulated space S in the negative pressure state. The purge nozzle unit 1 ensures a reliable up-and-down action of the nozzle main body 2 with a simple structure.

Figure 7:
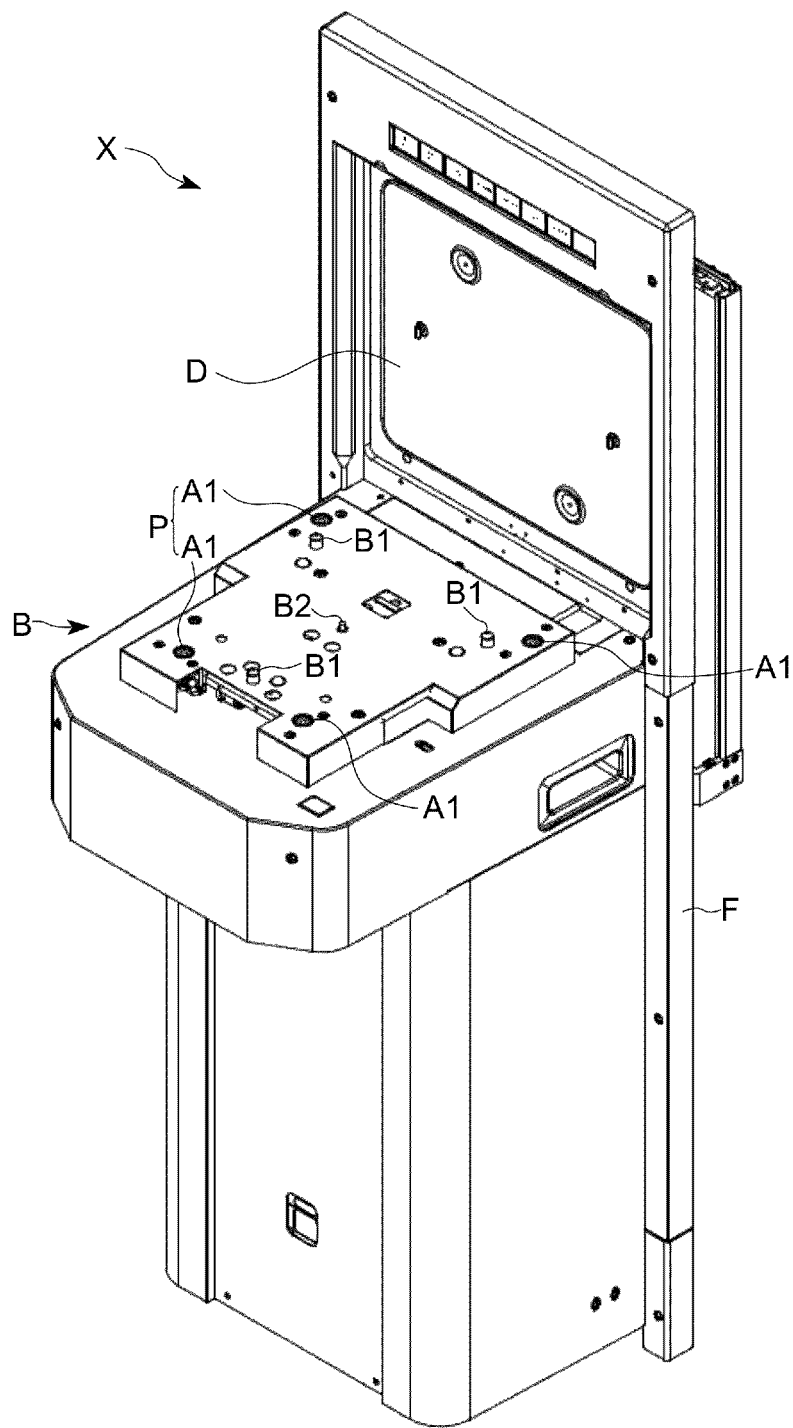
FIG. 7 is a view of the overall configuration of a load port according to another embodiment of the present invention.
Figure 8:
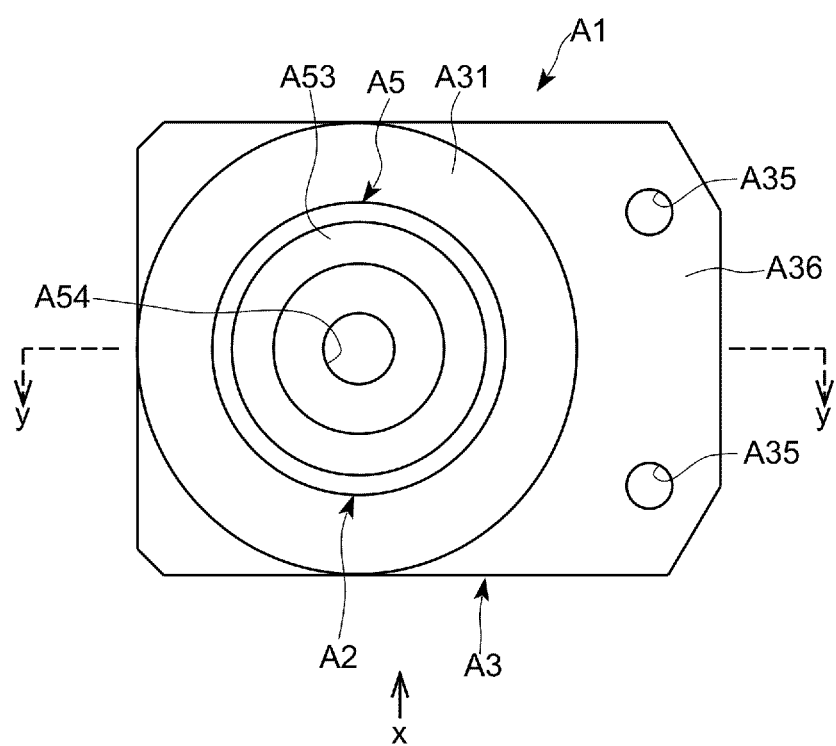
FIG. 8 is a plan view of a purge nozzle unit according to the embodiment.
Figure 9:
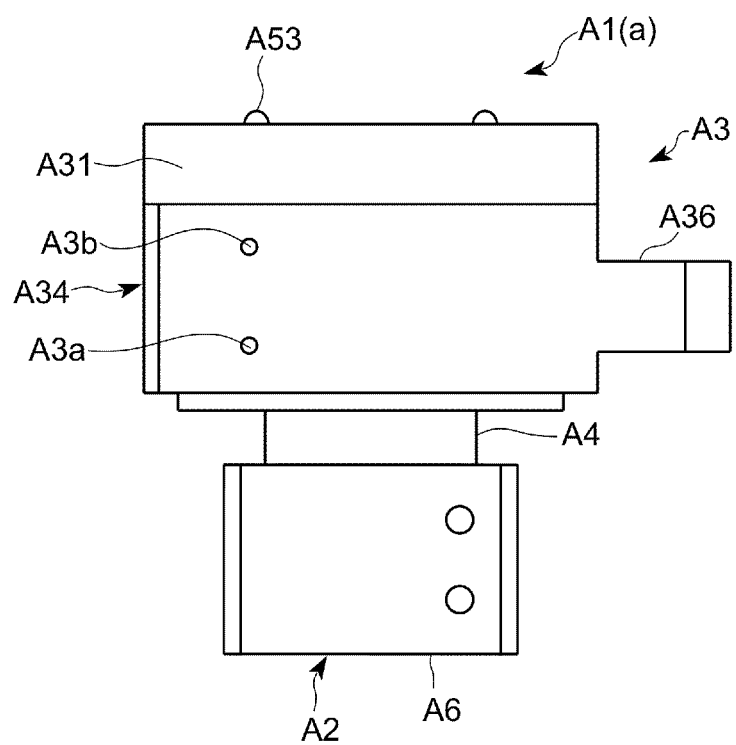
FIG. 9 is a view of the purge nozzle unit with a nozzle main body at a standby position in the embodiment, taken in the direction of an arrow x in FIG. 8.
Figure 10:
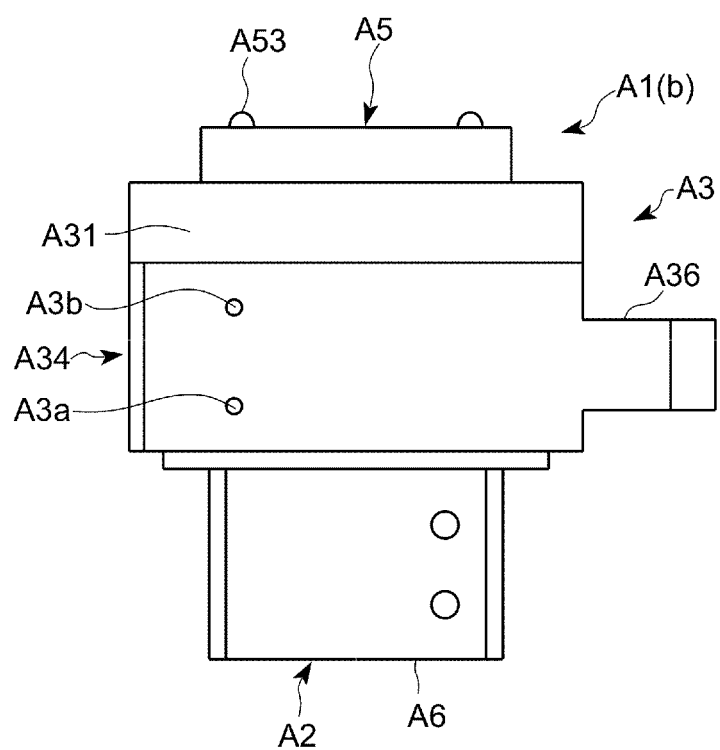
FIG. 10 is a view of the purge nozzle unit with the nozzle main body at a purge position in the embodiment, taken in the direction of the arrow x in FIG. 8.
Figure 11:
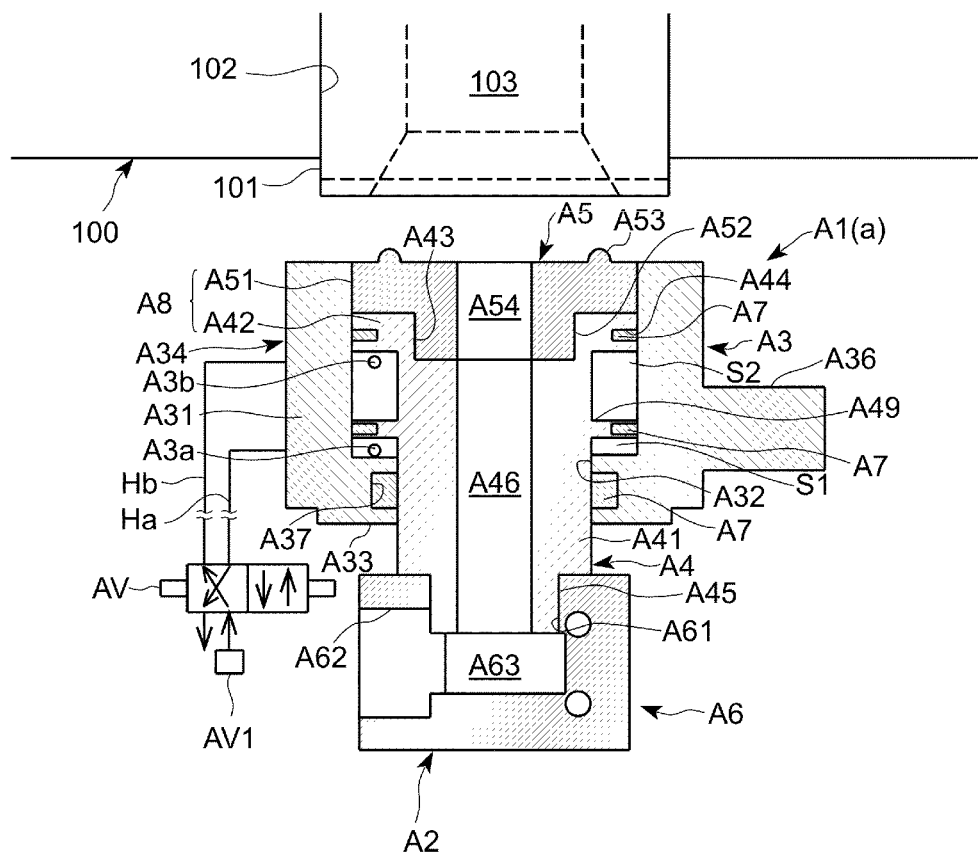
FIG. 11 is a cross-sectional view of the purge nozzle unit with the nozzle main body at the standby position in the embodiment, taken along line y-y in FIG. 8.

A purge nozzle unit A1 according to an embodiment (hereinafter referred to as a second embodiment) different from the above-described embodiment (hereinafter referred to as a first embodiment) will be described with reference to FIGS. 7 to 12 (FIG. 8 is a plan view of the purge nozzle unit A1, FIGS. 9 and 10 are views taken in the direction of an arrow x in FIG. 8, and FIGS. 11 and 12 are cross-sectional views taken along line y-y in FIG. 8).

As shown in FIGS. 8 to 12, each purge nozzle unit A1 according to the second embodiment includes a nozzle main body A2 and a holder A3 that holds the nozzle main body A2 such that the nozzle main body A2 can move up and down. The purge nozzle unit A1 according to the present embodiment is different from the purge nozzle unit 1 according to the first embodiment in that the purge nozzle unit A1 has two pressure-regulated spaces separated in a height direction (a lower pressure-regulated space S1 and an upper pressure-regulated space S2) between the nozzle main body A2 and the holder A3, as shown in FIGS. 11 and 12, and is identical to the purge nozzle unit 1 according to the first embodiment in that the purge nozzle units A1 constitute a purge apparatus P and can be used in a load port X, as shown in FIG. 7.

The nozzle main body A2 includes a main body section A4 that is mainly composed of a cylindrical trunk A41 and a large-diameter tubular section A42 larger in outer diameter than the trunk A41, a nozzle head A5 that can be attached to an upper end of the main body section A4, and a nozzle bottom A6 that can be attached to a lower end of the main body section A4.

A recess A43 for receiving the nozzle head A5 is formed in the upper end of the main body section A4 (a top face of the large-diameter tubular section A42). A ring-shaped recess A44 for receiving a seal member A7 to contact a side wall A31 of the holder A3 (to be described later) is formed in an outer side surface of the large-diameter tubular section A42. In the present embodiment, a small-diameter tubular section A45 having an outer diameter smaller than the outer diameter of the trunk A41 is provided on a lower end of the trunk A41, and the nozzle bottom A6 can be fit on the small-diameter tubular section A45. A purge gas flow path A46 is formed in a shaft center portion of the main body section A4 to extend therethrough in the height direction. As shown in FIGS. 11 and 12, the purge nozzle unit A1 according to the present embodiment includes a side protrusion A49 that protrudes outward from the trunk A41 of the nozzle main body A2 at a predetermined level. A ring-shaped recess for receiving the seal member A7 to contact the side wall A31 of the holder A3 (to be described later) is formed in an outer side surface of the side protrusion A49. The main body section A4 according to the present embodiment is made of metal and includes the components integral to each other.

The nozzle head A5 includes a head main body A51 having the same outer diameter as the large-diameter tubular section A42 of the main body section A4, a fitting protrusion A52 that protrudes downward from a lower end of the head main body A51 and can fit in (be press-fit in) the recess A43 of the main body section A4, and a port contact section A53 that is provided on a top face of the head main body A51 and can contact a port 101 (injection port or discharge port). In the present embodiment, the port contact section A53 is constructed as a ring-shaped upward protrusion protruding upward from the top face of the head main body A51. A head-side purge gas flow path A54 is formed in a shaft center portion of the nozzle head A5 to extend therethrough in the height direction and communicate with the purge gas flow path A46 of the main body section A4. The nozzle head A5 according to the present embodiment is made of metal and includes the components integral to each other.

In a state in which the fitting protrusion A52 of the nozzle head A5 is fit in the recess A43 of the main body section A4 and the two members are assembled together, the large-diameter tubular section A42 of the main body section A4 and the head main body A51 of the nozzle head A5 form an outer side surface (outward face) that is smoothly continuous in the height direction. The large-diameter tubular section A42 of the main body section A4 and the head main body A51 of the nozzle head A5 correspond to a collar section A8 according to the present invention.

The nozzle bottom A6 has a fitting recess A61 that can fit on the small-diameter tubular section A45 of the main body section A4 in a top face and is in the form of a rectangular cup. The nozzle bottom A6 includes a pipe-mounting recess A62 to which a flexible pipe connected to a purge gas source (not shown) can be attached and a bottom-side purge gas flow path A63 that communicates with an internal space of the pipe attached to the pipe-mounting recess A62 and communicates with the purge gas flow path A46 of the main body section A4. The width dimension of the nozzle bottom A6 is set to be larger than the outer diameter of the trunk A41 of the main body section A4 in a state in which the fitting recess A61 of the nozzle bottom A6 and the small-diameter tubular section A45 of the main body section A4 are assembled together while the fitting recess A61 fits on the small-diameter tubular section A45.

The holder A3 is mainly composed of a holder main body A34 including the side wall A31 with which an outward face (outer peripheral surface) of the collar section A8 of the nozzle main body A2 and an outward face (outer peripheral surface) of the side protrusion A49 is in slidable contact and a bottom wall A33 that protrudes inward (toward the center) from a lower end of the side wall A31 and has a through hole A32, in which only the trunk A41 of the nozzle main body A2 can be inserted, formed at a center and includes a fixed section A36 that protrudes sideward from the holder main body A34 and has screw insertion holes A35 formed at predetermined locations. In the present embodiment, of the side wall A31, an upper portion is defined in the form of a circular tube while the remaining portion is defined in the form of a rectangular tube. The side wall A31 of the holder A3 has vents that communicate with the outside (a lower vent A3a and an upper vent A3b). In the present embodiment, the two vents (the lower vent A3a and upper vent A3b) are formed at positions different in the height direction. The opening size of the through hole A32 formed in the bottom wall A33 is set such that an outward face of the trunk A41 of the nozzle main body A2 is in slidable contact with the through hole A32. A ring-shaped recess A37 for receiving the seal member A7 to contact the trunk A41 of the nozzle main body A2 is formed in an inward face of the through hole A32.

In order to cause the holder A3 to inseparably hold the nozzle main body A2, the main body section A4 may be inserted from above the holder A3 into the holder A3 while the nozzle bottom A6 is yet to be assembled to the small-diameter tubular section A45 of the main body section A4, the small-diameter tubular section A45 may be exposed from the through hole A32 in the bottom wall A33 to outside the holder A3, and the small-diameter tubular section A45 may be press-fit into the fitting recess A61 of the nozzle bottom A6. In the assembled state, the side protrusion A49 or the nozzle bottom A6 of the nozzle main body A2 rests against the bottom wall A33 of the holder A3, preventing the nozzle main body A2 from coming off. Note that assembly of the nozzle head A5 to the main body section A4 of the nozzle main body A2 may be done before or after the main body section A4 is put into the holder A3. Since a top face of the main body section A4 (the top face of the large-diameter tubular section A42) and a bottom face of the head main body A51 are set to be respective flat horizontal surfaces, the port contact section A53 of the nozzle head A5 (an upper end of the nozzle head A5) also has a flat horizontal surface in an attached state in which the horizontal surfaces abut on each other.

In the present embodiment, the nozzle main body A2 and holder A3 assembled together constitute the purge nozzle unit A1. The purge nozzle unit A1 according to the present embodiment is configured such that the outward face (side surface) of the side protrusion A49 is in slidable contact with the side wall A31 of the holder A3 like the collar section A8 while the nozzle main body A2 is held by the holder A3.

The purge nozzle unit A1 according to the present embodiment employs gas (pressurized air) as a drive source that vertically moves the nozzle main body A2 relative to the holder A3. The purge nozzle unit A1 is configured to change, relative to each other, pressures in the two pressure-regulated spaces (the lower pressure-regulated space S1 and upper pressure-regulated space S2) that are spaces formed between the holder A3 and the nozzle main body A2 and around which gas can circulate through the two vents (the upper vent A3b and lower vent A3a) formed in the side wall A31 of the holder A3, thereby vertically moving the nozzle main body A2 relative to the holder A3.

More specifically, the lower pressure-regulated space S1 is a space that is delimited by the trunk A41 and side protrusion A49 of the nozzle main body A2 and the side wall A31 and bottom wall A33 of the holder A3 while the upper pressure-regulated space S2 is a space that is delimited by the trunk A41, collar section A8, and side protrusion A49 of the nozzle main body A2 and the side wall A31 of the holder A3. In the present embodiment, high airtightness of the pressure-regulated spaces (the lower pressure-regulated space S1 and upper pressure-regulated space S2) is ensured by interposing the seal member A7 between the collar section A8 and the side wall A31, between the side protrusion A49 and the side wall A31, and between the trunk A41 and the bottom wall A33.

In the purge nozzle unit A1 according to the present embodiment, separate pipes (a lower pipe Ha and an upper pipe Hb) are connected to the respective vents (the lower vent A3a and upper vent A3b), and the operation of a switching section AV (e.g., an electromagnetic valve (solenoid valve)) is controlled. The switching section AV can be switched between a state (a first pressure-regulated state) in which the pressure in the lower pressure-regulated space S1 is made higher than the pressure in the upper pressure-regulated space S2 by injecting pressured gas into the lower pressure-regulated space S1 through the lower pipe Ha and lower vent A3a and simultaneously releasing gas in the upper pressure-regulated space S2 to the outside through the upper pipe Hb and upper vent A3b and a state (a second pressure-regulated state) in which the pressure in the upper pressure-regulated space S2 is made higher than the pressure in the lower pressure-regulated space S1 by injecting pressured gas into the upper pressure-regulated space S2 through the upper pipe Hb and upper vent A3b and simultaneously releasing gas in the lower pressure-regulated space S1 to the outside through the lower pipe Ha and lower vent A3a, so as to move the nozzle main body A2 vertically relative to the holder A3. Note that a gas source AV1 is connected to the switching section AV.

In the present embodiment, the nozzle main body A2 can be positioned at a position shown in FIGS. 9 and 11, i.e., a standby position (a) where a top face of the nozzle main body A2 (a top face of the nozzle head A5) and a top face of the holder A3 (a top face of the side wall A31) are substantially level with each other and the port contact section A53 is not in contact with the port 101 of a FOUP 100, by setting the switching section AV to the second pressure-regulated state. The nozzle main body A2 can also be positioned at a position shown in FIGS. 10 and 12, i.e., a purge position (b) where the top face of the nozzle main body A2 (the top face of the nozzle head A5) is above the level of the top face of the holder A3 (the top face of the side wall A31) and the port contact section A53 of the nozzle main body A2 can contact the port 101 of the FOUP 100, by setting the switching section AV to the first pressure-regulated state.

The nozzle main body A2 is configured such that, when the nozzle main body A2 moves vertically, the outward face of the collar section A8 and the outward face of the side protrusion A49 of the nozzle main body A2 come into sliding contact with an inward face of the side wall A31 of the holder main body A34, and the outward face of the trunk A41 of the nozzle main body A2 comes into sliding contact with the inward face of the through hole A32 formed in the bottom wall A33. This configuration allows smooth and reliable vertical movement of the nozzle main body A2.

The purge nozzle units A1 according to the present embodiment described in detail above function as the purge apparatus P that can replace a gaseous atmosphere in the FOUP 100 placed on a table B with purge gas by being attached to a plurality of predetermined locations on the table B of the load port X (near four corners of the table B in the present embodiment) in unit forms. Note that a process of attaching each purge nozzle unit A1 to the table B can be accomplished by fixing the purge nozzle unit A1 to the table B at an appropriate location using screws (not shown) inserted in the screw insertion holes A35 formed in the fixed section A36 of the holder A3. The top face of the holder A3 is set to be substantially level with a top face of the table B in the fixed state.

The purge apparatus P includes a plurality of purge nozzle units A1 that are arranged at predetermined locations with upper ends exposed at the table B and causes each of the plurality of purge nozzle units A1 to function as an injection purge nozzle unit that injects purge gas or a discharge purge nozzle unit that discharges a gaseous atmosphere in the FOUP 100. The ratios of injection purge nozzle units and discharge purge nozzle units to all the purge nozzle units may be equal or one of the ratios may be higher than the other.

The plurality of purge nozzle units A1 can be attached to appropriate positions on the table B corresponding to the positions of the ports 101 provided on a bottom of the FOUP 100. Note that each purge nozzle unit A1 (injection purge nozzle unit or discharge purge nozzle unit) has a valve function for regulating backflow of gas. Of the plurality of ports 101 provided on the bottom of the FOUP 100, the port 101 that contacts an injection purge nozzle unit functions as an injection port, while the port 101 that contacts a discharge purge nozzle unit functions as a discharge port.

The usage and action of the load port X in which the purge nozzle units A1 with the above-described configuration are provided to the table B will be described.

First, the FOUP 100 is transported by a transport apparatus such as an OHT (not shown) to the load port X and is placed on the table B. Each nozzle main body A2 can be positioned at the standby position (a) by setting the switching section AV to the second pressure-regulated state at this time. Positioning protrusions B1 fit in and come into contact with positioning recesses of the FOUP 100 to allow the FOUP 100 to be placed at a predetermined normal position on the table B. A seating sensor B2 detects that the FOUP 100 is placed at the normal position on the table B. At this time, each nozzle main body A2 is at its standby position (a) and is not in contact with the port 101. That is, the standby position (a) of the nozzle main body A2 is a position where an upper end of the nozzle main body A2 (the port contact section A53) is below the level of a lower end of the port 101 provided on the FOUP 100 while the positioning protrusions B1 engage with the positioning recesses, and the FOUP 100 is placed on the table B.

After the seating sensor B2 detects a normal seated state of the FOUP 100, the load port X according to the present embodiment switches the switching section AV from the second pressure-regulated state to the first pressure-regulated state to move up the nozzle main body A2 from the standby position (a) to the purge position (b). That is, the load port X increases the pressure in the lower pressure-regulated space S1 by injecting gas into the lower pressure-regulated space S1 through the lower vent A3a formed in the side wall A31 of the holder A3 and the lower pipe Ha connected to the lower vent A3a and makes the pressure in the lower pressure-regulated space S1 higher than the pressure in the upper pressure-regulated space S2 by discharging gas in the upper pressure-regulated space S2 to the outside through the upper vent A3b and the upper pipe Hb connected to the upper vent A3b. With this operation, the nozzle main body A2 is moved up relative to the holder A3.

As a result, as shown in FIG. 12, the port contact section A53 of the nozzle main body A2 comes into contact with the lower end of the port 101, an internal space 103 of the port 101 and the head-side purge gas flow path A54, purge gas flow path A46, and bottom-side purge gas flow path A63 of the nozzle main body A2 communicate with each other. In this state, the load port X according to the present embodiment injects purge gas supplied from the source (not shown) into the FOUP 100 through the internal space of the pipe, the bottom-side purge gas flow path A63, the purge gas flow path A46, the head-side purge gas flow path A54, and the internal space 103 of the port 101 and discharges gas that fills the FOUP 100 to outside the FOUP 100 through the discharge port(s) and discharge purge nozzle unit(s). Note that it is also possible to start discharge in advance of injection, discharge a certain amount of air in the FOUP 100 to outside the FOUP 100, and perform injection under reduced pressure.

After or during the above-described purging, the load port X according to the present embodiment sequentially expels wafers from the FOUP 100 into a semiconductor manufacturing apparatus through a carrying-in/carrying-out port of the FOUP 100 that communicates with an opening of a frame F. Each wafer transferred into the semiconductor manufacturing apparatus is then subjected to a semiconductor manufacturing process by a semiconductor manufacturing apparatus main body. The wafers having undergone the semiconductor manufacturing process by the semiconductor manufacturing apparatus main body are sequentially stored in the FOUP 100.

The load port X according to the present embodiment can continue bottom purging by the purge apparatus P even at the time of loading/unloading wafers. The load port X can continue replacing a gaseous atmosphere in the FOUP 100 with purge gas such as nitrogen gas during loading/unloading of wafers and keep the concentration of the purge gas in the FOUP 100 high.

When all the wafers have undergone the semiconductor manufacturing process and are stored in the FOUP 100, the load port X moves a door section D from an opened position to a closed position while the door section D is in close contact with a lid of the FOUP 100. With this operation, the opening of the load port X and the carrying-in/carrying-out port of the FOUP 100 are closed. The FOUP 100 placed on the table B is then carried out by a transport mechanism (not shown) to a next process. Note that the FOUP 100 containing wafers that have undergone the semiconductor manufacturing process may be subjected to bottom purging again, as needed. In this case, it is possible to immediately start purging the FOUP 100 containing wafers that have undergone the semiconductor manufacturing process to prevent the processed wafers from being oxidized.

As has been described in detail above, the load port X according to the present embodiment can keep a high degree of filling (the degree of replacement) with purge gas in the FOUP 100 through bottom purging by the purge apparatus P.

Of a plurality of wafers stored in the common FOUP 100, a first one stored in the FOUP 100 after the semiconductor manufacturing process is generally subjected to a gaseous atmosphere, in which the degree of filling (the degree of replacement) with purge gas decreases as wafer loading/unloading time passes, in the FOUP 100 and may be slightly adversely affected until the last one undergone the semiconductor manufacturing process is stored in the FOUP 100. By injecting purge gas into the FOUP 100 by the purge apparatus P, a reduction in the degree of filling (the degree of replacement) with purge gas in the FOUP 100 can be effectively inhibited, and wafers can be stored in good condition in the FOUP 100.

At a predetermined time when or after the FOUP 100 containing wafers that have undergone the semiconductor manufacturing process is passed to the transport mechanism, the switching section AV is switched from the second pressure-regulated state to the first pressure-regulated state, and each nozzle main body A2 is moved down from the purge position (b) to the standby position (a). That is, the pressure in the upper pressure-regulated space S2 is increased by injecting air into the upper pressure-regulated space S2 through the upper vent A3*b* formed in the side wall A31 of the holder A3 and the upper pipe Hb connected to the upper vent A3*b*, and the pressure in the upper pressure-regulated space S2 is made higher than the pressure in the lower pressure-regulated space S1 by discharging gas in the lower pressure-regulated space S1 to the outside through the lower vent A3*a* and the lower pipe Ha connected to the lower vent A3*a*. With this operation, the nozzle main body A2 is moved down relative to the holder A3. As a result, the nozzle main body A2 can be prevented from interfering with the bottom face of the FOUP 100 containing unprocessed wafers when the FOUP 100 is received from the transport mechanism onto the table B.

As described above, the purge nozzle unit A1 according to the present embodiment, which is composed of two parts as units: the nozzle main body A2 and holder A3, is configured to vertically move the nozzle main body A2 relative to the holder A3 by regulating a pressure difference between the two pressure-regulated spaces S1 and S2 formed between the nozzle main body A2 and the holder A3 through the vents (the lower vent A3*a* and upper vent A3*b*) formed in the side wall A31 of the holder A3. That is, in the purge nozzle unit A1 according to the present embodiment, an up-and-down action of the nozzle main body A2 can be performed by causing the nozzle main body A2 to operate as a piston (cylinder shaft) relative to the holder A3 as a cylinder, and aside from the two parts, any other mechanisms for vertically moving the nozzle main body A2 need not be separately provided. This achieves not only a reduction in the number of parts and a cost reduction but also a reduction in the overall size of the purge nozzle unit A1.

Additionally, the purge nozzle unit A1 according to the present embodiment is configured such that the nozzle main body A2 is vertically moved while, of the nozzle main body A2, not only the outward face of the collar section A8 but also the outward face of the side protrusion A49 that separates the two pressure-regulated spaces S1 and S2 in the height direction are in slidable contact with the inward face of the side wall A31 of the holder A3 and while the outward face of the trunk A41 of the nozzle main body A2 is in slidable contact with the inward face of the through hole A32 in the bottom wall A33 of the holder A3. This allows smooth and reliable vertical movement of the nozzle main body A2.

Moreover, as for the purge nozzle unit A1 according to the present embodiment, the assembly work of causing the holder A3 to hold the nozzle main body A2 to form a unit is easy. The purge nozzle unit A1 does not need control for simultaneously extending/contracting cylinders, as compared to an example that vertically moves the nozzle main body A2 by simultaneously extending/contracting a plurality of cylinders. The purge nozzle unit A1 can vertically move the nozzle main body A2 highly accurately with simple control of regulating a pressure difference between the two pressure-regulated spaces S1 and S2 and can provide higher reliability.

In particular, the purge nozzle unit A1 according to the present embodiment need not evacuate the pressure-regulated spaces (the lower pressure-regulated space S1 and upper pressure-regulated space S2) and is advantageous in that a negative pressure source (vacuum source) is unnecessary.

Note that the present invention is not limited to the above-described embodiment. For example, purge gas can also be used as gas used to regulate the pressure in each pressure-regulated space.

Although the above-described embodiments each have illustrated an example in which a pressure-regulated space and a vent are formed in a one-to-one relationship, a configuration may be adopted in which a plurality of vents are formed so as to communicate with one pressure-regulated space. A location where a vent is formed in a holder is not particularly limited as long as the vent communicates with a pressure-regulated space. For example, a vent may be formed in a bottom wall of the holder.

As a method for integrally assembling a nozzle head and a nozzle bottom to a nozzle main body, for example, various methods such as screwing, engagement, and bonding may be employed instead of or in addition to press fitting.

In the above-described embodiments, a main body section and a nozzle head of a nozzle main body are constructed from separate parts. For this reason, even if a port contact section of the nozzle main body that can contact a port wears abrasively or is deformed due to age-related deterioration or high frequency of use, good contact with the port that provides high airtightness can be ensured by replacing the nozzle head in use with a new nozzle head or a different nozzle head that is not abrasively worn and is not deformed. Alternatively, a nozzle main body into which a nozzle head and a main body section are integrated can also be used, though replacement or mending of only the nozzle head is impossible.

A seal member may not be interposed between a nozzle main body and a holder as long as high airtightness of a pressure-regulated space can be ensured.

Although the above-described embodiments have illustrated a FOUP as a purge container, another container (carrier) may be employed. A stored item in a purge container is not limited to a wafer and may be a glass substrate used in, e.g., a display device or a photoelectric conversion device.

A purge apparatus can be applied to something other than a load port, such as a storage that retains a purge container or a station dedicated to purging.

The specific configuration of each section is not limited to the above embodiments, and various modifications can be made without departing from the scope of the present invention.

What is claimed is:

1. A purge nozzle unit capable of replacing a gaseous atmosphere in a purge container with purge gas composed of nitrogen or dry air through a port provided on a bottom of the purge container, comprising
    a nozzle main body and a holder,
    the nozzle main body including a trunk that allows the purge gas to pass through and a collar section that protrudes outward from the trunk,
    the holder including a side wall that is in slidable contact with an outward face of the collar section and a bottom wall having a through hole in which the trunk is inserted while an outward face of the trunk is in slidable contact with the through hole,
    wherein the holder has a vent in communication with the outside, the vent formed in at least a part of the holder, and
    the nozzle main body is vertically moved relative to the holder by regulating a pressure in a pressure-regulated space that is formed between the nozzle main body and the holder and communicates with the vent.

2. The purge nozzle unit according to claim 1, wherein
    the pressure-regulated space comprises one pressure-regulated space, and
    the nozzle main body is moved up by supplying gas into the pressure-regulated space through the vent to increase the pressure in the pressure-regulated space and is moved down by discharging gas in the pressure-regulated space to the outside through the common vent to reduce the pressure in the pressure-regulated space.

3. The purge nozzle unit according to claim 1, wherein
    the pressure-regulated space comprises two pressure-regulated spaces separated in a height direction, and
    the nozzle main body is moved up by supplying gas into a lower one of the pressure-regulated spaces through one of vents constituting the vent that communicates with the lower pressure-regulated space and discharging gas in an upper one of the pressure-regulated spaces to the outside through one of the vents that communicates with the upper pressure-regulated space to make a pressure in the lower pressure-regulated space higher than a pressure in the upper pressure-regulated space, and
    the nozzle main body is moved down by supplying gas into the upper pressure-regulated space through the vent in communication with the upper pressure-regulated space and discharging gas in the lower pressure-regulated space to the outside through the vent in communication with the lower pressure-regulated space to make the pressure in the upper pressure-regulated space higher than the pressure in the lower pressure-regulated space.

4. A purge apparatus comprising a plurality of purge nozzle units according to claim 1 and capable of replacing a gaseous atmosphere in a purge container with nitrogen or dry air while the nozzle main bodies of the purge nozzle units are in communication with a plurality of ports provided on a bottom of the purge container.

5. A load port provided adjacent to a semiconductor manufacturing apparatus in a clean room for receiving a transported FOUP as a purge container and loading a wafer stored in the FOUP into the semiconductor manufacturing apparatus and unloading the wafer from the semiconductor manufacturing apparatus into the FOUP through a carrying-in/carrying-out port formed in a front face of the FOUP, comprising a purge apparatus according to claim 4.

* * * * *